US008742819B2

United States Patent
Merkin et al.

(10) Patent No.: US 8,742,819 B2
(45) Date of Patent: Jun. 3, 2014

(54) CURRENT LIMITING CIRCUITRY AND METHOD FOR PASS ELEMENTS AND OUTPUT STAGES

(71) Applicant: Texas Instruments Incorporated, Dallas, TX (US)

(72) Inventors: Timothy B. Merkin, Richardson, TX (US); Susan A. Curtis, Sherman, TX (US); Harish Venkataraman, Wylie, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/626,331

(22) Filed: Sep. 25, 2012

(65) Prior Publication Data

US 2014/0084994 A1 Mar. 27, 2014

(51) Int. Cl.
*H03L 5/00* (2006.01)

(52) U.S. Cl.
USPC .......... 327/309; 327/320

(58) Field of Classification Search
USPC .......... 327/309–320, 306
See application file for complete search history.

(56) References Cited

U.S. PATENT DOCUMENTS

| | | | | |
|---|---|---|---|---|
| 6,700,361 | B2 * | 3/2004 | Gregorius | 323/282 |
| 7,710,090 | B1 * | 5/2010 | Kimura | 323/276 |
| 8,004,257 | B2 * | 8/2011 | Imura et al. | 323/277 |
| 8,169,204 | B2 * | 5/2012 | Jian | 323/273 |

* cited by examiner

*Primary Examiner* — Dinh T. Le

(74) *Attorney, Agent, or Firm* — Alan A. R. Cooper; W. James Brady, III; Frederick J. Telecky, Jr.

(57) ABSTRACT

Circuitry (10-2) for limiting the maximum amount of current ($I_{REF}$) flowing through a first electrode (DRAIN) of a first transistor (T1) includes an amplifier (14) having an output coupled by a conductor (19) to a control electrode of the first transistor and limiting circuitry (17) including reference current sensing circuitry (22,$T_{SENSE}$) having a reference current source ($I_{REF\_SENSE}$). A reference current sensing transistor ($T_{SENSE}$) has a control electrode coupled to the control electrode of the first transistor, a first electrode coupled to a terminal (20) of the reference current source, and a second electrode (SOURCE) coupled to a second electrode of the first transistor. A buffer (T2) has an input coupled to the terminal of the reference current source. The maximum amount is limited in accordance with the reference current source to prevent an increase in magnitude of voltage applied by the amplifier to the first transistor.

14 Claims, 3 Drawing Sheets

CURRENT LIMITING CIRCUITRY AND METHOD FOR PASS ELEMENTS AND OUTPUT STAGES

BACKGROUND OF THE INVENTION

The present invention relates generally to circuits and methods for establishing upper limits to the amount of current flowing through a pass transistor or pass element in a circuit such as a linear voltage regulator, an output stage of an amplifier, or the like.

Providing robust circuitry for accurately limiting or clamping the current through the pass transistor of a linear regulator is important in many applications. There are many applications in which it is necessary to impose an accurate, PVT-independent (i.e., process, voltage, and temperature-independent) upper limit on the amount of current flowing through the pass transistor or pass element of a linear regulator or to control the slew rate of output stage transistors of an operational amplifier. Such applications may require system-wide reliability and safety, especially in cases in which external cables or external components are connected to an integrated circuit linear voltage regulator or operational amplifier.

FIG. 1 indicates the prior art in the context of a common regulator 10-1 including a pass transistor or pass element represented by a pass element circuit wherein a pass transistor has one terminal which receives a current $I_{MAIN}$ from a power source. The pass transistor together with an OTA (operational transconductance amplifier) and an external current setting resistor form a linear regulator that produces a constant reference current $I_{REF}$. The reference current is used for limiting, i.e., clamping, a large current $I_{MAIN}$ flowing through the pass transistor. In safety-critical applications it is very important that $I_{MAIN}$ be limited to a desired maximum value in the event of a malfunction which otherwise could cause $I_{MAIN}$ to be large enough to cause damage.

More specifically, switch SW1 in FIG. 1 is a MOS pass transistor that is part of a pass element circuit 15 of a regulator 10-1. Pass transistor SW1 regulates flow of $I_{MAIN}$ from power source 13 through conductor 11A so as to maintain a predetermined voltage across a load 21. Pass element circuit 15 is controlled in response to the current $I_{REF}$ produced by a linear regulator 18-1 so as to establish an upper limit to the value of regulated current $I_{MAIN}$. Linear regulator 18-1 includes OTA (operational transconductance amplifier) 14, which has its (+) input coupled to a reference voltage $V_{REF}$ and its (−) input coupled by conductor 16 to the junction between one terminal of a current setting resistor $R_{SET}$ and one terminal of a current limiting resistor $R_{LIMIT}$, the other terminal of which is connected to the source of a N-channel MOS pass transistor T1. The other terminal of current setting resistor $R_{SET}$ is connected to ground. The output 19 of OTA 14 is connected to the gate of pass transistor T1. The drain of pass transistor T1 is connected by conductor 12 to a control input of pass element circuit 15. The constant reference current $I_{REF}$ generated by linear regulator 18-1 flows into the control input 12 of pass element circuit 15. Linear regulator 18-1 thus performs a voltage-to-current conversion, converting $V_{REF}$ to $I_{REF}$. Pass element circuit 15 operates to compare a predetermined scaled multiple of $I_{REF}$ with $I_{MAIN}$ and accordingly controls the gate voltage of MOS pass transistor SW1 so as to prevent $I_{MAIN}$ from exceeding a desired maximum value in the event of a malfunction (such as an accidental short-circuiting of current setting resistor $R_{SET}$). Stated differently, linear regulator 18-1 controls reference current $I_{REF}$ so as to cause MOS pass transistor SW1 to "clamp" $I_{MAIN}$ so it never exceeds the desired maximum value and thereby protects linear regulator 18-1, pass element circuit 15, and load 21 from damage.

As subsequently explained in more detail with reference to FIG. 4, pass element circuit 15 operates to compare $I_{MAIN}$ to a scaled representation of $I_{REF}$. (Pass element circuit 15 in effect multiplies $I_{REF}$ by the scaling factor (e.g., by 40,000) before making the comparison.) The result of that comparison is used to control the gate voltage of MOS pass transistor SW1. Then, if $I_{REF}\times 40{,}000$ is less than $I_{MAIN}$, that means $I_{MAIN}$ is too great, so linear regulator 18-1, in effect, reduces the magnitude of the gate voltage of MOS pass transistor SW1 to prevent $I_{MAIN}$ from increasing further. However, if is $I_{REF}\times 40{,}000$ is greater than $I_{MAIN}$, then linear regulator 18-1 causes pass element circuit 15 to turn on MOS pass transistor SW1 as hard as possible.

Linear regulator 18-1 of Prior Art FIG. 1 operates to limit the current $I_{REF}$ through its pass transistor TI either by making transistor T1 small enough that it is incapable of sourcing too much current or by "choking" pass transistor T1 by coupling current limiting resistor current $R_{LIMIT}$ between the source of pass transistor T1 and one terminal of current setting resistor $R_{SET}$.

Unfortunately, neither of these techniques provides a precise current limit for $I_{REF}$ because the properties of transistor T1 and a current limiting resistor $R_{LIMIT}$ vary considerably with respect to variations in integrated circuit manufacturing process parameters, voltage values, and temperature. Also, reducing the current driving capability of pass transistor T1 (by either by making its channel-width-to-channel-length ratio small or by including $R_{LIMIT}$) reduces the loop gain of the regulation feedback loop including OTA 14, pass transistor T1, and $R_{LIMIT}$, and therefore reduces the accuracy of the reference current $I_{REF}$. Adding current limiting resistor $R_{LIMIT}$ also reduces the effect of transconductance of the pass element T1 and therefore also affects the loop gain, and therefore the accuracy, of the regulator circuit 18-1.

Thus, there is an unmet need for an improved circuit and method for increasing the accuracy of a maximum value of a reference current flowing through a pass transistor or amplifier output transistor.

There also is an unmet need for an improved circuit and method for increasing the accuracy of a maximum value of a reference current flowing through a pass transistor without using a current limiting resistor.

There also is an unmet need for an improved circuit and method for increasing the accuracy of a maximum value of a reference current flowing through a pass transistor without reducing the current conducting capability of a pass transistor.

There also is an unmet need for an improved circuit and method for increasing the accuracy of a maximum value of a reference current flowing through an amplifier output transistor without using a current limiting resistor in series with the source electrode of the pass transistor.

SUMMARY OF THE INVENTION

It is an object of the present invention to provide a circuit and method for increasing the accuracy of a reference current.

It is another object of the invention to provide an improved circuit and method for increasing the accuracy of a maximum value of a reference current flowing through a pass transistor without using a current limiting resistor.

It is another object of the invention to provide an improved circuit and method for increasing the accuracy of a maximum value of a reference current flowing through a pass transistor without reducing the current conducting capability of the pass transistor.

It is another object of the invention to provide an improved circuit and method for increasing the accuracy of a maximum value of a reference current flowing through an amplifier output transistor without using a current limiting resistor in series with the source electrode of a pass transistor.

Briefly described, and in accordance with one embodiment, the present invention provides circuitry (10-2) for limiting the maximum amount of current ($I_{REF}$) flowing through a first electrode (DRAIN) of a first transistor (T1) includes an amplifier (14) having an output coupled by a conductor (19) to a control electrode of the first transistor and limiting circuitry (17) including reference current sensing circuitry (22, $T_{SENSE}$) having a reference current source ($I_{REF\_SENSE}$). A reference current sensing transistor ($T_{SENSE}$) has a control electrode coupled to the control electrode of the first transistor (T1), a first electrode coupled to a terminal (20) of the reference current source (22), and a second electrode (SOURCE) coupled to a second electrode (SOURCE) of the first transistor. A buffer (T2) has an input coupled to the terminal (20) of the reference current source (22). The maximum amount of current ($I_{REF}$) is limited in accordance with the reference current source ($I_{REF\_SENSE}$) to prevent an increase in magnitude of voltage applied by the amplifier (14) to the first transistor (T1).

In one embodiment, the invention provides circuitry (e.g., 10-2 or 10-3) which limits the maximum amount of a current ($I_{REF}$) flowing through a first electrode (DRAIN) of a first transistor (e.g., T1, T7, or T8), including a first amplifier (14,14A) having a first output coupled by a first conductor (19,19A,19B) to a control electrode (GATE) of the first transistor (T1) and first current limiting circuitry (17,17A,17B). First current limiting circuitry (17,17A,17B) includes first reference current sensing circuitry (22,$T_{SENSE}$,22A,22B, $T_{SENSE\_BOT}$,$T_{SENSE\_TOP}$) which includes a first reference current source (22,$I_{REF\_SENSE}$,22A,22B). A first reference current sensing transistor ($T_{SENSE}$,$T_{SENSE\_BOT}$,$T_{SENSE\_TOP}$) has a control electrode (GATE) coupled to the control electrode (GATE) of the first transistor (e.g., T1, T7, or T8), a first electrode (DRAIN) coupled to a terminal (20,20A,20B) of the first reference current source (22,22A,22B $I_{REF\_SENSE}$), and a second electrode (SOURCE) coupled to a second electrode (SOURCE) of the first transistor (e.g., T1, T7, or T8). A first buffer (T2,T5,T6) has an input coupled to the terminal (20,20A,20B) of the first reference current source (22,$I_{REF\_SENSE}$,22A,22B). In one embodiment, the first transistor (T1) is a MOS transistor. In one embodiment, the first transistor is a pass transistor (T1) in a linear regulator (18-2). In one embodiment, the first transistor is an output transistor (T7,T8) of a second amplifier (10-3).

In one embodiment, the first reference current sensing transistor ($T_{SENSE}$) is an MOS transistor having a source coupled to a feedback conductor (16) that is also coupled to a (−) input of the first amplifier (14) and a first terminal of a current setting resistor ($R_{SET}$) having a second terminal coupled to a first reference voltage (GND), the first reference current sensing transistor ($T_{SENSE}$) having a gate coupled by the first conductor (19) to a gate of the first transistor (T1).

In one embodiment, the first buffer (T2) includes an MOS transistor having a source coupled to the first conductor (19) and a drain coupled to the first reference voltage (GND).

In one embodiment, the first transistor (T1) is an N-channel transistor, the first reference current sensing transistor ($T_{SENSE}$) is an equivalent N-channel transistor, and the first buffer (T2) includes a P-channel transistor having a source coupled to the first conductor (19) and a drain coupled to the first reference voltage (GND).

In one embodiment, the first current limiting circuitry (17) operates to prevent the reference current ($I_{REF}$) produced by the first transistor (T1) from exceeding a predetermined maximum value corresponding to a current ($I_{REF\_SENSE}$) produced by the first reference current source (22).

In one embodiment, a pass circuit (15) controls flow of a main current ($I_{MAIN}$) from a power source (13) to a load (21), the pass circuit (15) including another pass transistor (SW1) having a gate voltage controlled in response to the reference current ($I_{REF}$) produced by the first pass transistor (T1).

In one embodiment, the first amplifier (14,14A) is an operational transconductance amplifier. In one embodiment, the first transistor is a pull-down transistor (T8) of a class AB output stage (25) of a class AB amplifier (10-3) having an input stage (14A), the pull-down transistor (T8) having a gate coupled by the first conductor (19B) to the input stage (14A), the class AB output stage (25) also including a pull-up transistor (T7) having a gate coupled by a second conductor (19A) to the input stage (14A). In one embodiment, the pull-down transistor (T8) is an N-channel transistor, the first reference current sensing transistor ($T_{SENSE\_BOT}$) is an N-channel transistor, and the first buffer (T5) includes a P-channel transistor having a source coupled to the first conductor (19B) and a drain coupled to the first reference voltage (GND).

In one embodiment, second current limiting circuitry (17A) includes a second reference current sensing transistor ($T_{SENSE\_TOP}$), a second reference current source (22A), a second reference current sensing transistor ($T_{SENSE\_TOP}$) having a drain coupled to a terminal (20A) of a second reference current source (22A) and a source coupled to a second reference voltage ($V_{DD}$). A gate of the second reference current sensing transistor ($T_{SENSE\_TOP}$) is coupled to the gate of the pull-up transistor (T7), and a second buffer (T6) has an input coupled to the terminal (20A) of the second reference current source (22A), wherein the pull-up transistor (T7) is a P-channel transistor, the second reference current sensing transistor ($T_{SENSE\_TOP}$) is a P-channel-transistor, and the second buffer (T6) includes a N-channel transistor having a source coupled to the second conductor (19A) and a drain coupled to the second reference voltage ($V_{DD}$).

In one embodiment, the first reference current sensing transistor ($T_{SENSE}$) is an equivalent transistor having an effective channel-width-to-channel-length ratio which is scaled relative to a channel-width-to-channel-length ratio of the first transistor (T1), and the first reference current source ($I_{REF\_SENSE}$) operates to produce a current that is scaled relative to the maximum amount of the reference current ($I_{REF}$) in the first transistor (T1).

In one embodiment, the invention provides a method for limiting the maximum amount of a reference current ($I_{REF}$) flowing through a first electrode (SOURCE) of a first transistor (e.g., T1, T7, or T8), including coupling a first output (19,19A,19B) of a first amplifier (14,14A) to a control electrode (GATE) of the first transistor (e.g., T1, T7, or T8); sensing the amount of the reference current ($I_{REF}$) flowing through a first electrode (SOURCE) of the first transistor (e.g., T1, T7, or T8); comparing the sensed amount of the reference current ($I_{REF}$) with an amount of current ($I_{REF\_SENSE}$) produced by a first reference current source (22,22A, 22B, $I_{REF\_SENSE}$); and limiting the amount of the reference current ($I_{REF}$) flowing through the first electrode (SOURCE) of the first transistor (e.g., T1, T7, or T8) to a predetermined maximum value corresponding to the amount of current ($I_{REF\_SENSE}$) produced by a first reference current source (22,22A,22B, $I_{REF\_SENSE}$) if the sensed amount of the reference current ($I_{REF}$) exceeds the amount of current ($I_{REF\_SENSE}$) produced by the first reference current source (22,22A, 22B, $I_{REF\_SENSE}$), by preventing an increase in magnitude of voltage applied by the first amplifier (14,14A) to the control electrode (GATE) of the first transistor (e.g., T1, T7, or T8).

In one embodiment, the method includes coupling a control electrode (GATE) and a first electrode (SOURCE) of a first reference current sensing transistor ($T_{SENSE}$,$T_{SENSE\_BOT}$,$T_{SENSE\_TOP}$) to the control electrode (GATE) and a first electrode (SOURCE), respectively, of the first transistor (T1, T7, or T8) and coupling a second electrode (DRAIN) of the first reference current sensing transistor ($T_{SENSE}$,$T_{SENSE\_BOT}$,$T_{SENSE\_TOP}$) to the first reference current source (22, $I_{REF\_SENSE}$,22A,22B).

In one embodiment, the method includes operating a buffer (T2,T5,T6) in response to a signal on the second electrode (DRAIN) of the first reference current sensing transistor ($T_{SENSE}$,$T_{SENSE\_BOT}$,$T_{SENSE\_TOP}$) to overpower a signal on the first output (19,19B,19A) of the first amplifier (14A).

In one embodiment, the method includes limiting a current flowing through a pass transistor (SW1) to a predetermined maximum value in response to sensing of the maximum value of the reference current ($I_{REF}$) in the first transistor (T1, T7, or T8).

In one embodiment, the first transistor (T1) is an output transistor (T7,T8) of a second amplifier (10-3), and the method includes limiting a slew rate of the second amplifier.

In one embodiment, the invention provides a circuit for limiting the maximum amount of a reference current ($I_{REF}$) flowing through a first electrode (SOURCE) of a first transistor (e.g., T1, T7, or T8), including means (19) for coupling a first output (19,19A,19B) of a first amplifier (14,14A) to a control electrode (GATE) of the first transistor (e.g., T1, T7, or T8); means ($T_{SENSE}$) for sensing the amount of the reference current ($I_{REF}$) flowing through a first electrode (SOURCE) of the first transistor (e.g., T1, T7, or T8); means (22) for comparing the sensed amount of the reference current ($I_{REF}$) with an amount of current ($I_{REF\_SENSE}$) produced by a first reference current source (22,22A,22B, $I_{REF\_SENSE}$); and means (T2, T5, or T6) for limiting the amount of the reference current ($I_{REF}$) flowing through the first electrode (SOURCE) of the first transistor (e.g., T1, T7, or T8) to a predetermined maximum value corresponding to the amount of current ($I_{REF\_SENSE}$) produced by a first reference current source (22,22A,22B, $I_{REF\_SENSE}$) if the sensed amount of the reference current ($I_{REF}$) exceeds the amount of current ($I_{REF\_SENSE}$) produced by the first reference current source (22,22A, 22B, $I_{REF\_SENSE}$), by preventing an increase in magnitude of voltage applied by the first amplifier (14,14A) to the control electrode (GATE) of the first transistor (e.g., T1, T7, or T8).

DETAILED DESCRIPTION OF THE PREFERRED EMBODIMENTS

Figure 1:
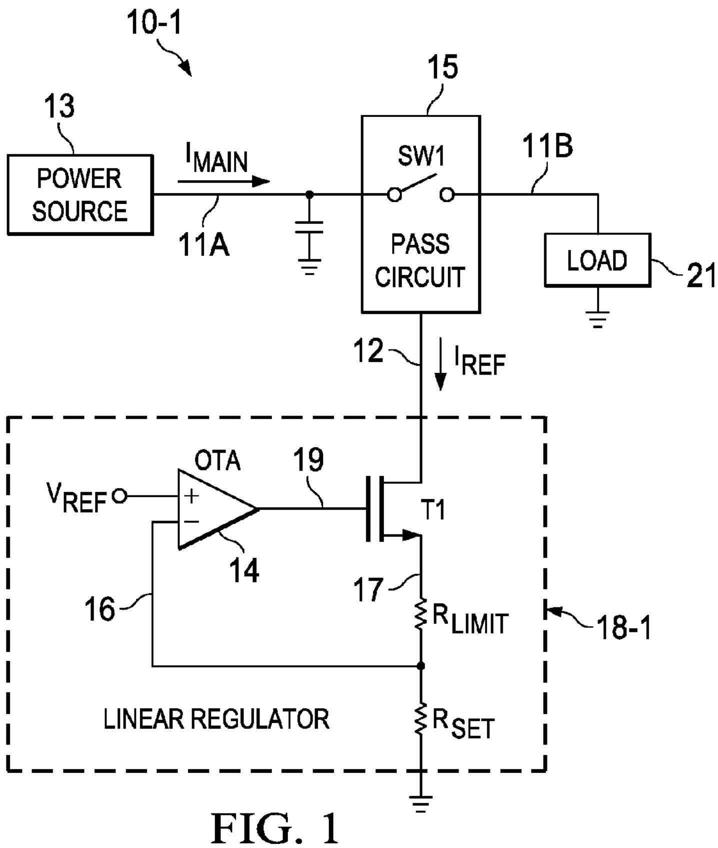
FIG. 1 (PRIOR ART)
FIG. 1 is a schematic diagram of a conventional linear regulator which controls a current that is utilized to limit, i.e., clamp, the amount of current flowing through a pass transistor.
Figure 2:
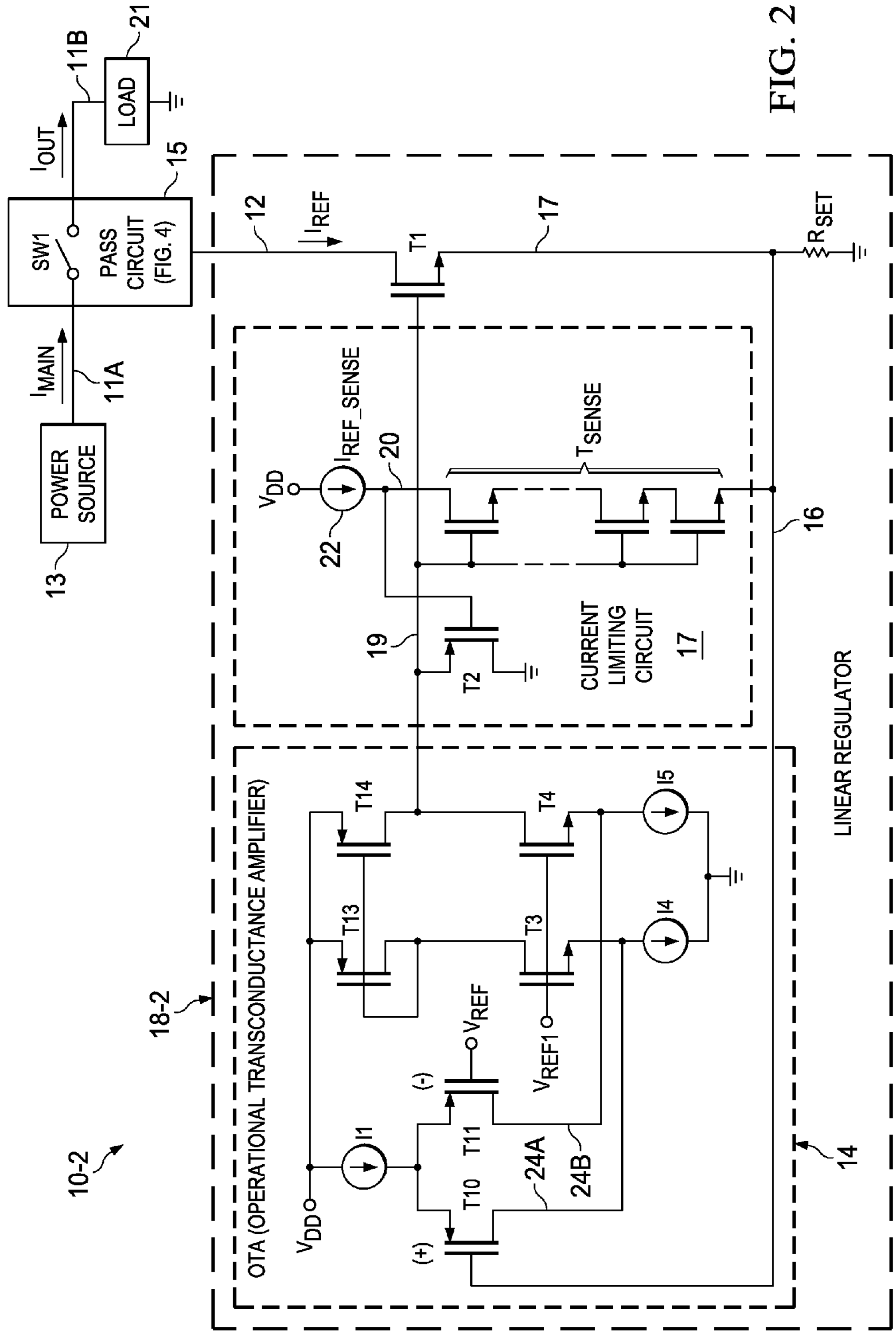
FIG. 2 is a schematic diagram illustrating a current limiting circuitry used without use of a current limiting resistor to limit or clamp the amount of current flowing through pass transistor.

As in Prior Art FIG. 1, switch SW1 in FIG. 2 is a MOS pass transistor included in pass element circuit 15 of a current regulator or clamp 10-2 which regulates flow of current $I_{MAIN}$ from power source 13 through MOS pass transistor SW1 so as to maintain a maximum current into a load 21. Pass element circuit 15 (details of which are shown in subsequently described FIG. 4) is controlled by a linear regulator 18-2 so as to establish an accurate upper limit to the value of regulated current $I_{MAIN}$. Linear regulator 18-2 includes above mentioned OTA (operational transconductance amplifier) 14.

OTA 14 includes a differential input stage in which a P-channel input transistor T10 has its source connected to the source of another P-channel input transistor T11 and to one terminal of a tail current source I1. The drain of input transistor T10 is connected by conductor 24A to the source of a N-channel cascode transistor T3 and to one terminal of a constant current source 14, the other terminal of which is connected to ground. Similarly, the drain of input transistor T11 is connected by conductor 24B to the source of a N-channel cascode transistor T4 and to one terminal of a constant current source 15, the other terminal of which is connected to ground. The gates of cascode transistors T3 and T4 are connected to a reference voltage $V_{REF1}$. The drain of cascode transistor T3 is connected to the gate and drain of a P-channel current mirror input transistor T13 and to the gate of a P-channel current mirror output transistor T14. The sources of current mirror transistors T13 and T14 are connected to $V_{DD}$. The drain of cascode transistor T4 is connected by conductor 19 to the drain of current mirror output transistor T14. The gate of input transistor T10 is connected to feedback conductor 16, and the gate of input transistor T11 is connected to a reference voltage $V_{REF}$.

Feedback conductor 16 is connected to one terminal of a current setting resistor $R_{SET}$ and the source of a N-channel MOS pass transistor T1. The gate of pass transistor T1 is connected to the output 19 of OTA 14, and the drain of pass transistor T1 is connected by conductor 12 to a control input of pass element circuit 15. The other terminal of current setting resistor $R_{SET}$ is connected to ground. In operation, linear regulator 18-2 generates a regulated constant reference current $I_{REF}$ which flows into the control input 12 of pass element circuit 15, so linear regulator 18-1 performs a voltage-to-current conversion by converting $V_{REF}$ to $I_{REF}$ and pass element circuit 15 operates to compare a predetermined scaled multiple of $I_{REF}$ with $I_{MAIN}$ and accordingly controls the gate voltage of MOS pass transistor SW1 so as to prevent $I_{MAIN}$ from exceeding a maximum value determined by $I_{REF}$ in the event of a malfunction, such as an accidental short-circuiting of current setting resistor $R_{SET}$.

A current limiting circuit 17 in FIG. 2 includes a scaled reference current sensing N-channel transistor $T_{SENSE}$, which may be composed of a single transistor or it may include a number of N-channel transistors connected in series to form an "effective" or "equivalent" transistor, as needed to provide a desired amount of scaling of reference current $I_{REF}$ that may be appropriately compared with $I_{REF\_SENSE}$ in order to determine whether to limit or clamp $I_{REF}$ and thereby limit or clamp $I_{MAIN}$. The gate of reference current sensing transistor $T_{SENSE}$ is connected to conductor 19 and hence to the gate of pass transistor T1. Reference current sensing transistor $T_{SENSE}$ has its source connected to feedback conductor 16 and hence to the source of pass transistor T1. The drain of reference current sensing transistor $T_{SENSE}$ is coupled by conductor 20 to one terminal of constant reference current source $I_{REF\_SENSE}$, the other terminal of which is connected to $V_{DD}$. Conductor 20 also is connected to the gate of a N-channel buffer transistor T2 which is connected as a source follower (but buffer transistor T2 could be replaced by any suitable non-inverting buffer circuit). The source of buffer transistor T2 is connected to amplifier output conductor 19 and its drain is connected to ground. The purpose of buffer transistor T2 is to limit or "overpower" the voltage produced on conductor 19 by OTA 14, and thereby limit or clamp the gate voltage of pass transistor T1 when necessary to clamp $I_{REF}$ to its desired maximum safe value. It should be noted that reference current sensing transistor $T_{SENSE}$ and pass transistor T1 are diode-connected N-channel transistors having their sources and gates connected together, and therefore their drain currents are scaled proportionally in accordance with their relative effective channel-width to channel-length ratios.

As the current through pass transistor T1 increases (e.g. because of a decrease in $R_{SET}$ or a short-circuiting of conductor 16 to ground), the "replica current" that is mirrored from pass transistor T1 through reference current sensing transistor $T_{SENSE}$ increases proportionally to $I_{REF}$. As the replica current in reference current sensing transistor $T_{SENSE}$ increases to a value greater than $I_{REF\_SENSE}$, the voltage on conductor 20 decreases, which turns buffer transistor T2 on harder, and that clamps the voltage on amplifier output conductor 19 to a maximum amplitude and therefore also causes $I_{REF}$ to be clamped at its desired maximum value.

That is, if reference current sensing transistor $T_{SENSE}$ starts drawing more current from conductor 20 than the constant current $I_{REF\_SENSE}$ being supplied to conductor 20 by current source 22, then the voltage of conductor 20 decreases, turning P-channel transistor T2 on harder so it "overpowers" the output of OTA 14. The feedback loop formed by $I_{REF}$, $T_{SENSE}$, and T2 overcomes the OTA feedback loop and forces the exact gate voltage on pass transistor T1 required to ensure that the replica current in $T_{SENSE}$ equals $I_{REF\_SENSE}$. Hence a "clamped" or maximum upper limit value of $I_{REF}$ is achieved, and that results in a corresponding upper limit or clamped value of the main current $I_{MAIN}$ in pass transistor SW1. (It should be understood that an operational transconductance amplifier generally has a limited output current driving capability, whereas an operational amplifier ordinarily has a relatively high output current driving capability. Source follower buffer transistor T2 therefore is designed to be sufficiently large to be able to sink more than the maximum output current which can be supplied by OTA 14. To keep power dissipation low, OTA 14 should have a relatively low output current driving capability, and therefore transistor T2 does not need to be very large MOS transistor.)

Figure 3:
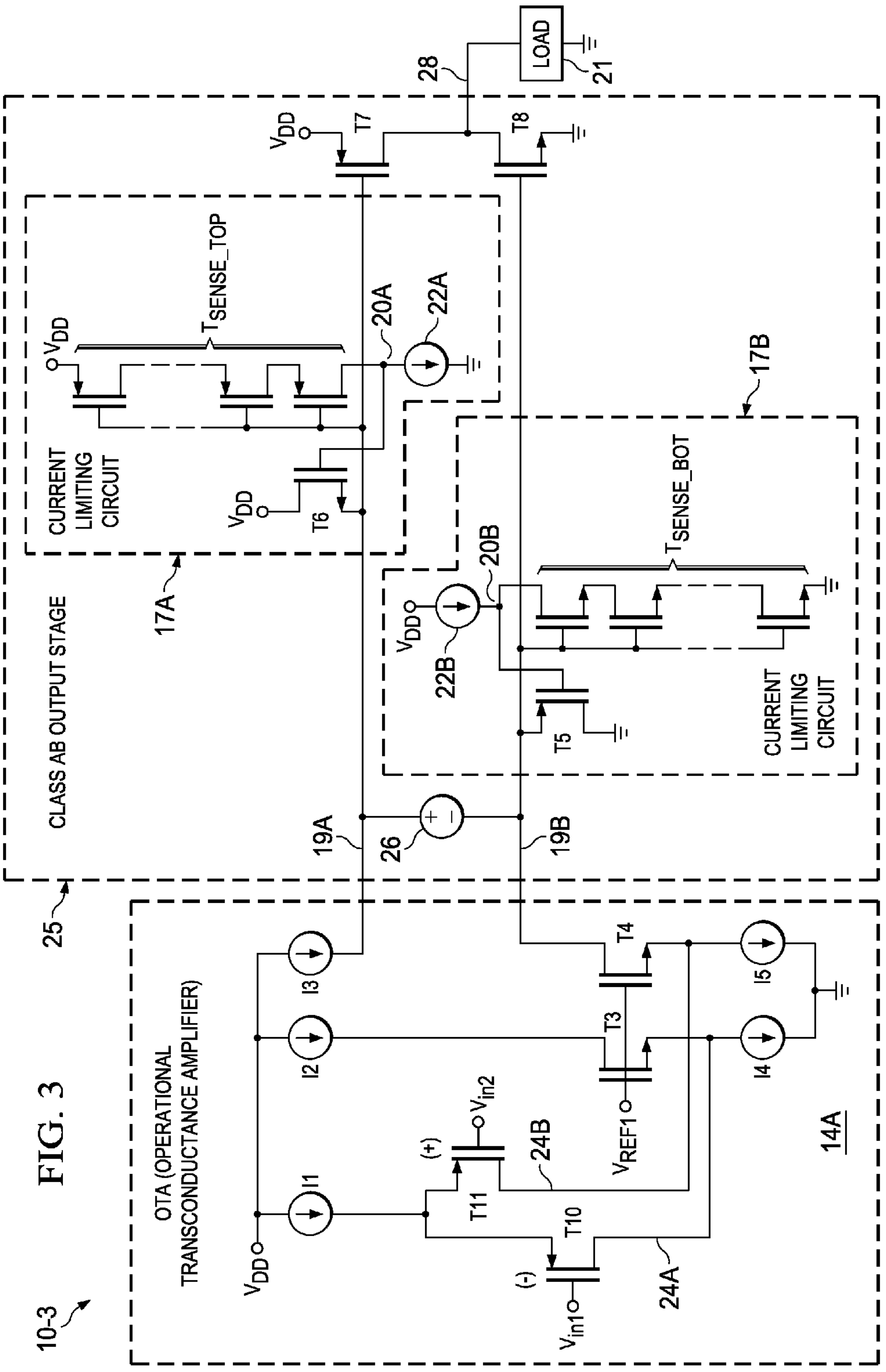
FIG. 3 is a schematic diagram of a class AB operational amplifier including an operational transconductance amplifier driving a class AB output stage which includes upper and lower current limiting circuitry for limiting the slew rates of the class AB output stage.

FIG. 3 shows a class AB amplifier 10-3 including an operational transconductance amplifier 14A and a class AB output stage 25. Class AB output stage 25 utilizes two separate current limiting circuits of the kind described with respect to FIG. 2 for controlling or limiting or clamping the slew rate of output stage 25. OTA 14A in FIG. 3 is similar to OTA 14 shown in FIG. 2. However, the gates of input transistors T10 and T11 in FIG. 3 are connected to input voltages Vin1 and Vin2, respectively, and the drain of cascode transistor T4 is connected by OTA output conductor 19B to the (−) terminal of a voltage source 26 in class AB output stage 25, and the (+) terminal of voltage source 26 is connected by OTA output conductor 19A to one terminal of constant current source I3. (Voltage source 26 may be implemented by means of a pair of back-to-back diode-connected MOS transistors.) Class AB output stage 25 includes a P-channel pull-up transistor T7 having its source connected to $V_{DD}$, its gate connected to OTA output conductor 19A, and its drain connected by output conductor 28 to load 21. Similarly, a P-channel pull-down transistor T8 has its source connected to ground (or $V_{SS}$), its gate connected to OTA output conductor 19B, and its drain connected to output conductor 28.

Class AB output stage 25 includes an upper or "top" current limiting circuit 17A that is similar to current limiting circuit 17 in FIG. 2. In class AB output stage 25, upper current limiting circuit 17A includes a scaled reference current sensing transistor P-channel transistor $T_{SENSE\_TOP}$ which may be composed of a single transistor or a number of P-channel transistors connected in series to form an equivalent transistor as needed to provide a desired amount of scaling of the current in reference circuit sensing transistor $T_{SENSE\_TOP}$ so that current may be appropriately compared with the current through pull-up transistor T7. The gate of reference current sensing transistor $T_{SENSE\_TOP}$ is connected to OTA output conductor 19A. Reference current sensing transistor $T_{SENSE\_TOP}$ has its source connected to $V_{DD}$ and its drain coupled by conductor 20A to one terminal of constant current source 22A. OTA output conductor 20A also is connected to the gate of a N-channel buffer transistor T6 which is connected as a source follower. The source of buffer transistor T6 is connected to OTA output conductor 19A and its drain is connected to $V_{DD}$. The purpose of buffer transistor T6 is to overcome or clamp the output generated by OTA 14A if necessary so as to limit or clamp the voltage produced on OTA output conductor 19A, and thereby correspondingly limit or clamp the current in P-channel pull-up transistor T7.

Similarly, class AB output stage 25 includes a lower or "bottom" current limiting circuit 17B that is essentially the same as current limiting circuit 17 in FIG. 2. In class AB output stage 25, lower current limiting circuit 17B includes a scaled reference current sensing transistor N-channel transistor $T_{SENSE\_BOT}$ which may be composed of a single transistor or a number of N-channel transistors connected in series as needed to provide a desired amount of scaling of the current in transistor $T_{SENSE\_BOT}$ so that current may be appropriately compared with the current through pull-down transistor T8. The gate of reference current sensing transistor $T_{SENSE\_BOT}$ is connected to OTA output conductor 19B. Reference current sensing transistor $T_{SENSE\_BOT}$ has its source connected to ground and its drain coupled by conductor 20B to one terminal of a constant current source 22B, the other terminal of which is connected to $V_{DD}$. Conductor 20B also is connected to the gate of a P-channel buffer transistor T5 which is connected as a source follower. The source of buffer transistor T5 is connected to OTA output conductor 19B and its drain is connected to ground. The purpose of buffer transistor T5 is to overcome or clamp the voltage produced on conductor 19B by operational transconductance amplifier 14A if necessary, and thereby limit or clamp the current in N-channel pull-down transistor T8.

Figure 4:
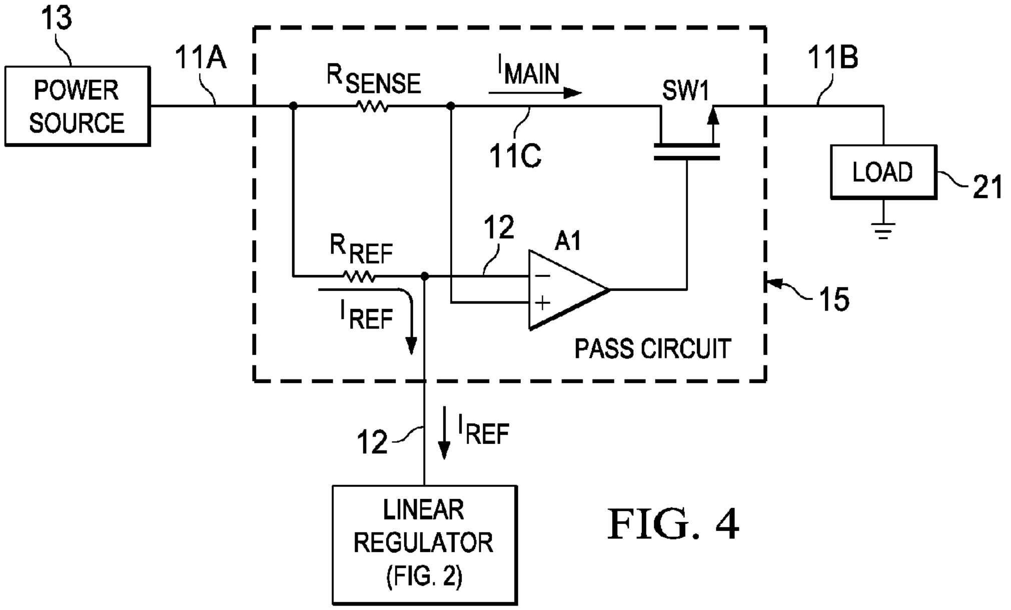
FIG. 4 is a schematic diagram illustrating an implementation of the pass circuit 15 shown in FIG. 2.

FIG. 4 shows how pass circuit 15 in FIGS. 1 and 2 may be implemented to convert the reference current $I_{REF}$ in FIG. 2 into a control voltage applied to the gate of N-channel pass transistor SW1. The source of pass transistor SW1 is connected to load 21 by conductor 11B. The drain of pass transistor SW1 is connected by conductor 11C to one terminal of a shunt resistor $R_{SENSE}$, the other terminal of which is connected by conductor 11A to power source 13 and to one terminal of a reference resistor $R_{REF}$. Conductor 11C also is connected to the (+) input of an operational amplifier A1. The (−) input of operational amplifier A1 is connected by conductor 12 (FIG. 2) to the other terminal of reference resistor $R_{REF}$. The reference current $I_{REF}$ is induced by linear regulator 18-2 (as shown in FIG. 2), and flows through reference resistor $R_{REF}$. Therefore, operational amplifier A1 functions to amplify the difference between the voltage drop induced by $I_{MAIN}$ across shunt resistor $R_{SENSE}$ and the voltage drop induced by $I_{REF}$ across reference resistor $R_{REF}$.

In the example of FIG. 4, the resistance of reference resistor $R_{REF}$ is scaled up (e.g., by a factor of 40,000) relative to the resistance of shunt resistor $R_{SENSE}$, so $I_{REF}$ can be approximately equal to $I_{MAIN} \div 40{,}000$ and the corresponding voltage drops across $R_{SENSE}$ and $R_{REF}$ are comparable. The output of amplifier A1 is connected to the gate of N-channel pass transistor SW1. In operation, pass transistor SW1 initially is turned completely on, and the current $I_{MAIN}$ generates a relatively small voltage drop across the very low resistance of shunt resistor $R_{SENSE}$. In this example, since $R_{REF}$ is about 40,000 times greater than shunt resistor $R_{SENSE}$, $I_{REF}$ is about 40,000 times smaller than $I_{MAIN}$. If the voltage drop across shunt resistor $R_{SENSE}$ is smaller than the voltage drop across reference resistor $R_{REF}$, then $I_{REF} \times R_{REF}$ is less than $I_{MAIN} \times R_{SENSE}$, and the amplitude of $I_{MAIN}$ is too large if there is too much voltage drop across shunt resistor $R_{SENSE}$. If that is the case, amplifier A1 operates to appropriately reduce or clamp the gate voltage of pass transistor SW1. (In this example, amplifiers A1 actually functions as a comparator.)

The very precise maximum current limit imposed by the above described current limiting circuit 17 can be used similarly for many applications including, but not limited to, short circuit protection and precision slew rate control. This is accomplished without reducing the size and current conducting capability of the pass transistor and without using a current limiting resistor in series with the source electrode of the pass transistor.

While the invention has been described with reference to several particular embodiments thereof, those skilled in the art will be able to make various modifications to the described embodiments of the invention without departing from its true spirit and scope. It is intended that all elements or steps which are insubstantially different from those recited in the claims but perform substantially the same functions, respectively, in substantially the same way to achieve the same result as what is claimed are within the scope of the invention. For example, in some cases it might be possible to use bipolar transistors instead of field effect transistors.

What is claimed is:

1. Circuitry for limiting the maximum amount of a current flowing through a first electrode of a first transistor, comprising:

(a) a first amplifier having a first output coupled by a first conductor to a control electrode of the first transistor; and (b) first current limiting circuitry including (1) first reference current sensing circuitry which includes a first reference current source, (2) a first reference current sensing transistor having a control electrode coupled to the control electrode of the first transistor, a first electrode coupled to a terminal of the first reference current source, and a second electrode coupled to a second electrode of the first transistor, and (3) a first buffer having an input coupled to the terminal of the first reference current source, wherein the first transistor is a MOS transistor, and wherein the first reference current sensing transistor is an MOS transistor having a source coupled to a feedback conductor that is also coupled to an input of the first amplifier and a first terminal of a current setting resistor having a second terminal coupled to a first reference voltage, the first reference current sensing transistor having a gate coupled by the first conductor to a gate of the first transistor.

2. The circuitry of claim 1 wherein the first buffer includes an MOS transistor having a source coupled to the first conductor and a drain coupled to the first reference voltage.

3. The circuitry of claim 1 wherein the first transistor is an N-channel transistor, the first reference current sensing transistor is an N-channel transistor, and the first buffer includes a P-channel transistor having a source coupled to the first conductor and a drain coupled to the first reference voltage.

4. The circuitry of claim 1 wherein the first current limiting circuitry operates to prevent a reference current produced by the first transistor from exceeding a predetermined maximum value corresponding to a current produced by the first reference current source.

5. The circuitry of claim 1 including a pass circuit for controlling flow of a main current from a power source to a load, the pass circuit including another pass transistor having a gate voltage controlled in response to the reference current produced by the first transistor.

6. The circuitry of claim 1 wherein the first amplifier is an operational transconductance amplifier.

7. The circuitry of claim 1 wherein the first transistor is a pull-down transistor of a class AB output stage of a class AB amplifier having an input stage, the pull-down transistor having a gate coupled by the first conductor to the input stage, the class AB output stage also including a pull-up transistor having a gate coupled by a second conductor to the input stage.

8. The circuitry of claim 7 wherein the pull-down transistor is an N-channel transistor, the first reference current sensing transistor is an N-channel transistor, and the first buffer includes a P-channel transistor having a source coupled to the first conductor and a drain coupled to the first reference voltage.

9. The circuitry of claim 8 including second current limiting circuitry including a second reference current sensing transistor, a second reference current source, a second reference current sensing transistor having a drain coupled to a terminal of a second reference current source and a source coupled to a second reference voltage, a gate of the second reference current sensing transistor being coupled to the gate of the pull-up transistor, and a second buffer having an input coupled to the terminal of the second reference current source, wherein the pull-up transistor is a P-channel transistor, the second reference current sensing transistor is a P-channel-transistor, and the second buffer includes a N-channel transistor having a source coupled to the second conductor and a drain coupled to the second reference voltage.

10. The circuitry of claim 1 wherein the first reference current sensing transistor has an effective channel-width-to-channel-length ratio which is scaled relative to a channel-width-to-channel-length ratio of the first transistor, and wherein the first reference current source produces a current that is scaled relative to the maximum amount of the reference current in the first transistor.

11. A method for limiting the maximum amount of a reference current flowing through a first electrode of a first transistor, the method comprising:

(a) sensing the amount of the reference current flowing through a first electrode of the first transistor; wherein a first output of a first amplifier is coupled to a control electrode of the first transistor;

(b) comparing the sensed amount of the reference current with an amount of current produced by a first reference current source; and (c) limiting the amount of the reference current flowing through the first electrode of the first transistor to a predetermined maximum value corresponding to the amount of current produced by a first reference current source if the sensed amount of the reference current exceeds the amount of current produced by the first reference current source, by preventing an increase in magnitude of voltage applied by the first amplifier to the control electrode of the first transistor, and limiting a current flowing through a pass transistor to a predetermined maximum value in response to sensing of the maximum value of the reference current in the first transistor.

12. The method of claim 11 including wherein a control electrode and a first electrode of a first reference current sensing transistor is coupled to the control electrode and the first electrode, respectively, of the first transistor and coupling a second electrode of the first reference current sensing transistor to the first reference current source.

13. The method of claim 12 including operating a buffer in response to a signal on the second electrode of the first reference current sensing transistor to overpower a signal on the first output of the first amplifier.

14. A circuit for limiting the maximum amount of a reference current flowing through a first electrode of a first transistor, comprising:

(a) a first output of a first amplifier coupled to a control electrode of the first transistor;

(b) means for sensing the amount of the reference current flowing through a first electrode of the first transistor;

(c) means for comparing the sensed amount of the reference current with an amount of current produced by a first reference current source; and (d) means for limiting the amount of the reference current flowing through the first electrode of the first transistor to a predetermined maximum value corresponding to the amount of current produced by a first reference current source if the sensed amount of the reference current exceeds the amount of current produced by the first reference current source, by preventing an increase in magnitude of voltage applied by the first amplifier to the control electrode of the first transistor, wherein the first transistor is a MOS transistor, and wherein the first means for sensing the amount of the reference current reference includes a current sensing transistor that is an MOS transistor having a source coupled to a feedback conductor that is also coupled to an input of the first amplifier and a first terminal of a current setting resistor having a second terminal coupled to a first reference voltage, the first reference current sensing transistor having a gate coupled by the first conductor to a gate of the first transistor.

* * * * *